United States Patent
Nussbaum et al.

(10) Patent No.: US 10,827,273 B2
(45) Date of Patent: Nov. 3, 2020

(54) DUAL LOUDSPEAKER ENABLED COOLING

(71) Applicant: Apple Inc., Cupertino, CA (US)

(72) Inventors: Michael B. Nussbaum, Santa Cruz, CA (US); Jason C. Della Rosa, Morgan Hill, CA (US); Glenn K. Trainer, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/698,136

(22) Filed: Nov. 27, 2019

(65) Prior Publication Data

US 2020/0169812 A1  May 28, 2020

Related U.S. Application Data

(60) Provisional application No. 62/771,739, filed on Nov. 27, 2018.

(51) Int. Cl.
*H04R 9/02* (2006.01)
*H04R 1/02* (2006.01)
*H05K 7/20* (2006.01)

(52) U.S. Cl.
CPC ............ *H04R 9/022* (2013.01); *H04R 1/025* (2013.01); *H05K 7/20127* (2013.01)

(58) Field of Classification Search
CPC ..... H04R 9/022; H04R 1/025; H05K 7/20127
See application file for complete search history.

(56) References Cited

U.S. PATENT DOCUMENTS

2005/0121171 A1* 6/2005 Mukasa ................ F04F 7/00
165/80.3

* cited by examiner

*Primary Examiner* — Mark Fischer
(74) *Attorney, Agent, or Firm* — Kilpatrick Townsend and Stockton LLP

(57) ABSTRACT

Electronics devices according to embodiments of the present technology may include a first loudspeaker and a second loudspeaker disposed in a housing. The housing may define a first internal volume between a first end of the housing and a backside of the first loudspeaker. The housing may define a second internal volume between a second end of the housing and a backside of the second loudspeaker. The first loudspeaker and the second loudspeaker may be positioned within the housing so a front side of the first loudspeaker faces a front side of the second loudspeaker. A duct may be defined by the housing, which may access the first internal volume at a first end and may access the second internal volume at a second end. The electronic device may also include a processor configured to deliver signals to the first loudspeaker and the second loudspeaker.

20 Claims, 3 Drawing Sheets

DUAL LOUDSPEAKER ENABLED COOLING

CROSS-REFERENCES TO RELATED APPLICATIONS

This application claims the benefit of U.S. Provisional Patent Application No. 62/771,739, filed on Nov. 27, 2018, and which is hereby incorporated by reference in its entirety for all purposes.

TECHNICAL FIELD

The present technology relates to electronic devices. More specifically, the present technology relates to loudspeaker operation within electronic devices.

BACKGROUND

Home audio systems may be capable of a number of functions from playing audio to providing internet searching results and feedback to user queries. The systems may be compact, which may challenge internal cooling.

SUMMARY

Electronics devices according to embodiments of the present technology may include a first loudspeaker and a second loudspeaker. The devices may include a housing in which the first loudspeaker and the second loudspeaker are disposed. The housing may define a first internal volume between a first end of the housing and a backside of the first loudspeaker. The housing may define a second internal volume between a second end of the housing and a backside of the second loudspeaker. The first loudspeaker and the second loudspeaker may be positioned within the housing so a front side of the first loudspeaker faces a front side of the second loudspeaker. A duct may be defined by the housing, and the duct may access the first internal volume at a first end of the duct and may access the second internal volume at a second end of the duct. The electronic device may also include a processor configured to deliver signals to the first loudspeaker and the second loudspeaker.

In some embodiments, the first loudspeaker and the second loudspeaker are axially aligned. The first internal volume and the second internal volume may be of dissimilar size. The electronic devices may also include a plurality of ducts extending between the first internal volume and the second internal volume. The processor may be configured to deliver signals in a first mode that operates the first loudspeaker in phase with the second loudspeaker to produce an audio output from the electronic device. The processor may be configured to deliver signals in a second mode that operates the first loudspeaker out of phase with the second loudspeaker. The signals delivered in the second mode may be at frequencies below about 20 Hz. Signals delivered in the second mode may be configured to produce airflow from the duct within the first internal volume or the second internal volume. The airflow may be characterized by a velocity at the first end of the duct of greater than or about 1 m/s. The processor may be further configured to operate in the first mode and the second mode simultaneously.

Some embodiments of the present technology may also encompass an audio system. The audio system may include a sealed enclosure. The audio system may include a first loudspeaker disposed in the sealed enclosure and at least partially defining a first internal volume of the sealed enclosure. The audio system may also include a second loudspeaker disposed in the sealed enclosure and at least partially defining a second internal volume of the sealed enclosure. The audio system may include a duct extending between the first internal volume of the sealed enclosure and the second internal volume of the sealed enclosure. The audio system may include a processor. The audio system may include memory having stored therein instructions which when executed by the processor cause the processor to deliver a first signal to the first loudspeaker. The instructions may further cause the processor to deliver a second signal to the second loudspeaker causing the second loudspeaker to operate out of phase with the first loudspeaker causing airflow within the sealed enclosure.

In some embodiments, the first loudspeaker and the second loudspeaker may be disposed within the sealed enclosure facing one another. The first loudspeaker and the second loudspeaker may be axially aligned. The first loudspeaker and the second loudspeaker may be similarly sized woofers. The first loudspeaker and the second loudspeaker may each be characterized by a maximum excursion of at least about 5 mm. The first signal and the second signal may each be at a frequency below or about 20 Hz. The instructions may further cause the processor to deliver a third signal to the first loudspeaker. The instructions may further cause the processor to deliver a fourth signal to the second loudspeaker causing the second loudspeaker to operate in phase with the first loudspeaker causing audio output from the audio system. Delivery of the second signal to the second loudspeaker and delivery of the fourth signal to the second loudspeaker may overlap in time.

Some embodiments of the present technology may encompass an electronic device. The electronic device may include a first loudspeaker. The electronic device may include a second loudspeaker. The electronic device may include a housing in which the first loudspeaker and the second loudspeaker are disposed. The housing may define a first internal volume between a first end of the housing and a backside of the first loudspeaker. The housing may define a second internal volume between a second end of the housing and a backside of the second loudspeaker. The first loudspeaker and the second loudspeaker may be positioned within the housing so a front side of the first loudspeaker faces a front side of the second loudspeaker. The electronic device may include a duct defined by the housing, the duct accessing the first internal volume at a first end of the duct and accessing the second internal volume at a second end of the duct. The electronic device may also include a processor configured to deliver signals in a cooling mode that operates the first loudspeaker out of phase with the second loudspeaker.

In some embodiments, the processor may be further configured to deliver signals in an audio mode that operates the first loudspeaker in phase with the second loudspeaker to produce an audio output from the electronic device. The processor may be configured to deliver signals in the cooling mode and signals in the audio mode simultaneously.

Such technology may provide numerous benefits over conventional technology. For example, the present technology may provide audio systems capable of performing air circulation to reduce component temperatures. Additionally, the cooling may be performed simultaneously during other operations, which may improve device performance and efficiency. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
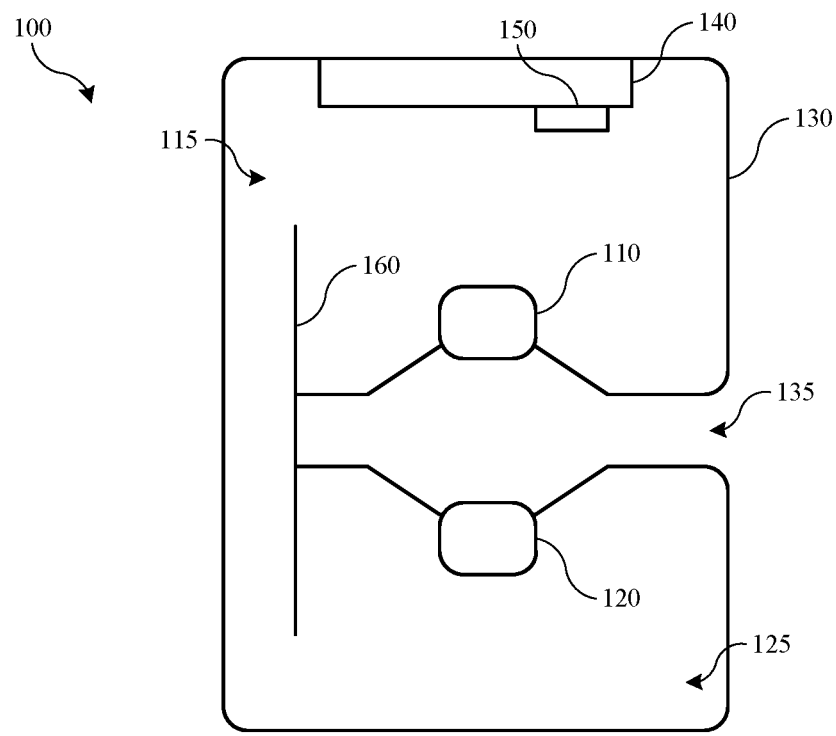
FIG. 1 shows a schematic cross-sectional elevation view of an electronic device according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Home audio systems may encompass a range of electronic devices such as portable speaker systems, home entertainment systems, computer setups, and voice-controlled speakers and personal assistants. As with many electronic devices, development has led to smaller, more compact devices. Although many electronic systems have similarly reduced in size, many home audio systems may incorporate a host of electronics within a relatively small form factor. For example, home audio systems may include one or more loudspeakers, microphones, sensors including environmental and motion sensing, lighting, and electronic hardware including circuit boards having processors, memory, wireless capabilities including device pairing and network access, and a variety of other components that may often be included in electronic devices. Unlike many larger electronic devices, such as computers, for example, many home audio systems may be premised on limited noise during operation, which may remove items like cooling fans from some home audio systems that may produce audible noise with the cooling operations.

Because of the increased functionality in limited form factors, heat generation and dissipation may be an issue. For example, internal processing components may generate heat during operations that may create stratified air layers within the device that can impact operation and efficiency of processing. Many conventional devices have limited capabilities for expelling produced heat, and may have increased requirements on device operational environments, device placement to ensure adequate airflow, and other restrictions. The present technology may overcome these issues by utilizing particular loudspeaker configurations that may promote airflow within the electronic device, and provide force cancellation of two loudspeakers operating in opposite directions. Manipulating in-phase and out-of-phase movement of the loudspeakers, as well as adjusting some housing configurations, exemplary devices according to the present technology may produce internal air flow that may be used to convectively cool heat-generating components within the devices.

Although the remaining portions of the description may reference small form factor devices having a number of components, it will be readily understood by the skilled artisan that the technology is not so limited. The present techniques may be employed with any number of loudspeaker devices and systems, which may benefit from the present configurations and operation.

FIG. 1 shows a schematic cross-sectional elevation view of an electronic device 100 according to some embodiments of the present technology. Device 100 may be an audio system in some embodiments, and may include a first loudspeaker 110 and a second loudspeaker 120. The loudspeakers may be disposed within an enclosure or housing 130. Although illustrated with limited components for explanation purposes, it is to be understood that device 100 may include any number of additional components in a variety of configurations. For example, device 100 may include microphones or recording devices, antennas or other communication features, lighting and/or power capabilities, cameras, sensors including environmental sensors and motion sensors or positioning sensors. Device 100 may also include one or more printed circuit boards or circuit components. For example, in one embodiment, one or more circuit boards 140 may be disposed within housing 130. Although illustrated as coupled near an end of the device 100, it is to be understood that the circuit components may be positioned or distributed throughout the internal volume of the device. Device 100 may have one or more processors 150 for controlling any of the noted components. The processors may be communicatively coupled with memory and other storage or networking features. Certain aspects of processors 150 will be described in more detail below.

Housing 130 may include a number of configurations, shapes, and sizes, and the configuration shown is for explanatory purposes only. However, in some embodiments any variety of housing configurations may include one or more common features. Housing 130 may be a vented enclosure in some embodiments, although in some embodiments housing 130 may be a sealed enclosure to produce a closed internal volume. First loudspeaker 110 and second loudspeaker 120 may be positioned facing outward from a sealed internal volume of housing 130, and may each be positioned to face outward towards a spacing 135 accessing the external environment. In some embodiments a mesh or other covering may at least partially cover the spacing 135. Although illustrated at a relatively central location, it is to be understood that the loudspeaker positioning may be moved up or down adjusting the longitudinal location of the spacing 135 in some embodiments.

First loudspeaker 110 and second loudspeaker 120 may be or represent a number of different loudspeakers that may be incorporated in exemplary electronic devices. The loudspeakers may be drivers or transducers incorporating a number of components for sound production including a cone as illustrated, along with associated driver components including a suspension, voice coil, spider, and magnets. Additional loudspeakers may similarly be used where the loudspeaker is characterized by an amount of translational movement within the housing. Although illustrated with a cone configuration, it is to be understood that in some embodiments dome drivers or other diaphragm configurations may be similarly used in some embodiments of the present technology. The loudspeakers may be or include any number of frequency-based drivers, and each may be a woofer, mid-range loudspeaker, tweeter, or combination. For example, in some embodiments the first loudspeaker and the second loudspeaker may both be woofers, and may be identical loudspeakers, although in some embodiments the speakers may differ in either size or frequency range.

In some embodiments the first loudspeaker 110 and the second loudspeaker 120 may be positioned within the housing so that a front side of the first loudspeaker 110 faces a front side of the second loudspeaker 120, although in some embodiments the loudspeakers may face in a similar direction. In some embodiments the first loudspeaker 110 and the second loudspeaker may be axially aligned. The two loudspeakers may be axially aligned along a central longitudinal axis through the housing. In some embodiments the loudspeakers may be offset from a central axis through the housing, although the loudspeakers may be axially aligned along a parallel axis. In some embodiments the loudspeakers may be offset from one another although facing each other as disposed within the housing, although depending on the amount of offset, an amount of torque may be applied on the device during operation.

First loudspeaker 110 and second loudspeaker 120 may be disposed within housing 130 to at least partially define one or more internal volumes within the device 100. In some embodiments, a first internal volume 115 may be defined at or proximate a first end of the device, and a second internal volume 125 may be defined at or proximate a second end of the device. The internal volumes may be defined on one or more sides by the housing as well as by a backside of the loudspeakers. For example, first internal volume 115 may be defined by housing 130 and a backside of first loudspeaker 110. Additionally, second internal volume 125 may be defined between housing 130 and a backside of second loudspeaker 120. Thus, housing 130 may define multiple separate internal volumes, which may be at least partially closed volumes. For example, either or both of first internal volume 115 and second internal volume 125 may not be accessible outside of housing 130. In some embodiments, the internal volumes may be at least partially accessible from within the device 100, while being isolated from an external environment. First internal volume 115 may be identical to second internal volume 125 in some embodiments, and in some embodiments first internal volume 115 may be dissimilar to second internal volume 125. For example first internal volume 115 may be larger or smaller than second internal volume 125. Either or both of first internal volume 115 and second internal volume 125 may include one or more components, such as electronic components, within the internal volume. Additionally, first internal volume 115 and second internal volume 125 may be fluidly coupled in one or more ways.

For example, a duct 160 may be positioned or defined within housing 130. Duct 160 may be defined by housing 130, or may be positioned within housing 130 in some embodiments. Housing 130 and duct 160 may be the same or different materials in some embodiments, and one or either component may include any number of structural materials including plastics, such as extruded plastics, fabrics, fibers, metals, or any number of other housing components that may be used with electronic and/or audio devices. Duct 160 may be formed as a channel within housing 130, which may otherwise be closed from an external environment. Duct 160 may form a tubular duct between first internal volume 115 and second internal volume 125. For example, duct 160 may access the first internal volume at a first end of the duct 160, and may access the second internal volume 125 at the second end of the duct. Depending on the device configuration, a plurality of ducts may extend between the first internal volume 115 and the second internal volume 125 in some embodiments. By utilizing a duct between the two otherwise closed internal volumes, device 100 may be characterized by a single back-volume compliance, whether the volumes are of identical size or not.

First loudspeaker 110 and second loudspeaker 120 may receive any type of signals from one or more processors, which may cause the loudspeakers to vibrate or operate in one or more ways. For example, the loudspeakers may receive analog signals causing an audible output from one or both loudspeakers, and the loudspeakers may also receive signals causing translation of the loudspeakers without audible output in some embodiments. Processor 150, which may include one or more processors, as well as a number of other audio system components, may be a digital signal processor, or may be a number of other components configured to perform a number of operations. As a signal processor, the component may decode files received from a number of sources including internal memory, coupled or tethered devices, external sources including internet sources, as well any other known source of material. In addition, the processor may produce text-to-speech signals to be output by the loudspeakers or may operate with a number of other components internally and/or externally to housing 130 to perform a variety of functions as an audio speaker system, digital assistant system, or other home automation system.

Accordingly, processor 150 may further include or be a general purpose microprocessor, an application specific integrated circuit, a programmable gate array, hardware logic structures, or other circuit structures or components. It is to be understood that although device 100 is being described with a processor and two transducers, the device may include a number of other common or specific components of speaker and or digital assistant devices, including input converters, such as an analog-to-digital converter or optical signal converter electronically coupled with a microphone or input source, or output converters such as a digital-to-analog converter electronically coupled with the loudspeakers. The system may include other components including amplifiers, filters or crossovers, and other components that may be used in an audio device. The system may also include memory sources, including transitory and non-transitory computer-readable mediums, which may have instructions to be performed by the one or more processors to deliver signals, code or decode signals including audio signals, or perform any other function of the electronic device. Put another way, device 100 may include any number of components and structures for controlling and operating electronic devices that may include one or more loudspeakers.

Device 100 may be operated in a number of modes. The remaining description will focus on an embodiment in which the first loudspeaker and the second loudspeaker are similarly sized transducers, although it is to be understood the technology may also be operated with differently sized loudspeakers, such as with a woofer and a tweeter, for example, as well as with speaker systems including more than two loudspeakers. Accordingly, the remaining description is to be considered exemplary of the technology without necessarily limiting the claims to any particular arrangement.

As discussed previously, many electronic devices include a compact design with limited cooling capabilities. While larger heat-generating systems may include air or fluid cooling, many electronic devices, such as device 100 in some embodiments, may not include an integrated fan. In some embodiments the device may include a fan that may be incapable of producing airflow throughout the device as well. For example, airflow may be produced in one section of the device, although other sections may not have sufficient air movement to provide dedicated cooling. In one non-limiting example, device 100 may include electronic components at or proximate a top of the device, such as illustrated in FIG. 1, for example. During operation, these components may generate heat, which may heat the surrounding air. Because the device housing may be substantially closed, air movement within the internal volume may be limited, and heated air within the volume may be stratified around the components, further generating heat. This may reduce operational efficiency of the components, and in some occurrences may cause device temperature faults. By incorporating a duct and loudspeaker system according to some embodiments of the present technology, circulation within internal volumes may be produced by operation of the loudspeakers, which may be used to cool internal components.

Figure 2:
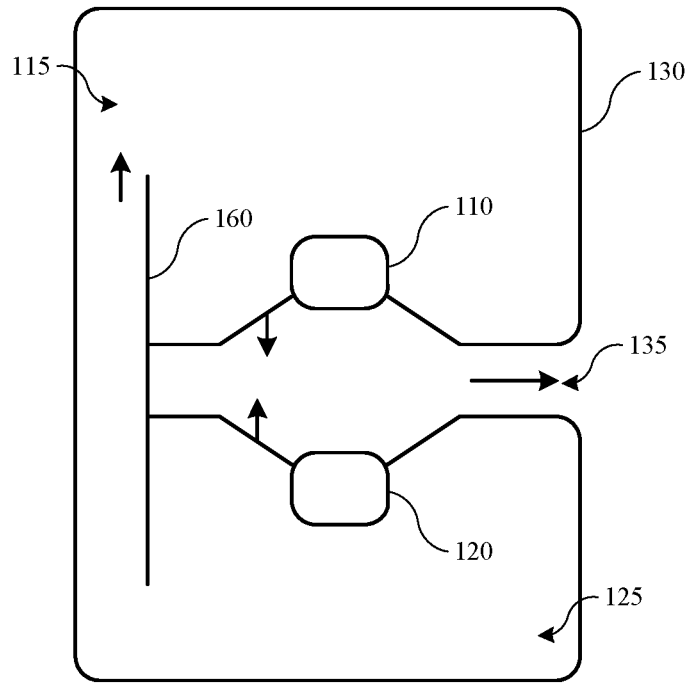
FIG. 2 shows a schematic cross-sectional elevation view of an electronic device according to some embodiments of the present technology.

FIG. 2 shows a schematic cross-sectional elevation view of electronic device 100 in operation according to some embodiments of the present technology. FIG. 2 may include any or all of the components discussed previously, and may include any component identified in FIG. 1. FIG. 2 may illustrate an electronic device according to some embodiments of the present technology when in operation in a first mode, for example, such as an audio output mode. In this mode, signals may be delivered to the loudspeakers from a processor as previously described. One or more processors may deliver a first signal or set of signals to the first loudspeaker 110 and a second signal or set of signals to the second loudspeaker 120. The signals may be provided at a frequency configured to produce audio output of any of the types previously described. The second signal may be provided to the second loudspeaker to operate the second loudspeaker 120 in phase with first loudspeaker 110 as illustrated in FIG. 2. By in phase may be meant that although the speakers may be moving in opposite directions axially as illustrated, the loudspeakers are operating in tandem or additively to produce an acoustic output. The produced sound waves may exit spacing 135 as illustrated.

Depending on the volume desired, an amount of airflow may also occur within housing 130. For example, volume from the speaker may relate to the amplitude of movement of the speaker, which may further compress the air within the closed internal volumes. As noted above, in some embodiments the first internal volume 115 and the second internal volume 125 may be dissimilar in size. The size of the loudspeaker relative to the size of the duct with two dissimilar internal volumes may facilitate air movement, as well as acoustics. For example, a woofer of a specific size will displace a certain volume of air during excursion at a particular frequency from a delivered signal. The dissimilar volumes of the two internal volume sections for a similar woofer excursion from the first loudspeaker and the second loudspeaker may cause a displacement disparity facilitating airflow through the duct 160, which again depending on frequency, duct size, and woofer size and excursion, may cause an amount of airflow or circulation within the two internal volumes based on the directional airflow changes within the duct.

When velocities at the duct entrances are sufficiently high, an air current may be formed to circulate air within the volume. The louder the output from the loudspeakers, the further the excursion and displacement, and thus the further increased peak airflow velocity at the duct inlet/outlet. Accordingly, in some devices according to the present technology, peak velocity at the duct outlet may be greater than or about 0.1 m/s, greater than or about 0.5 m/s, greater than or about 1 m/s, greater than or about 5 m/s, greater than or about 10 m/s, greater than or about 20 m/s, greater than or about 30 m/s, greater than or about 40 m/s, or higher. The airflow may also occur at the inlet/outlet to the duct at any individual or fractional velocity within any of these stated ranges, or at any smaller range of velocities encompassed by any of these stated ranges.

Depending on the device size and configuration, velocities above or about 20 m/s may cause audible air movement within the housing, known as chuffing. However, when in the first mode of operation, these velocities may be associated with high volume operation, which may dampen or effectively limit any noticeable noise during operation. In some embodiments, the duct, speakers, and housing may all be sized to maintain internal airflow velocities at either duct inlet below or about 20 m/s at maximum excursion of either loudspeaker. Additionally, in some embodiments, again based on specific component sizes and arrangements, the system may be configured to produce peak air velocity at either inlet/outlet to the duct to ensure circulation within a particular internal volume, such as greater than or about 1 m/s.

Accordingly, when device 100 may be operating in a first mode of operation where delivered signals cause the loudspeakers to operate in phase, cooling airflow may be produced within the housing. However, in this first mode of operation, the circulation may be proportional to volume from the loudspeaker, which may increase loudspeaker excursion. Thus, at lower volumes, loudspeaker excursion may be reduced, and sufficient airflow within the device may not occur in some embodiments. This situation will be revisited below with respect to FIG. 4.

Figure 3:
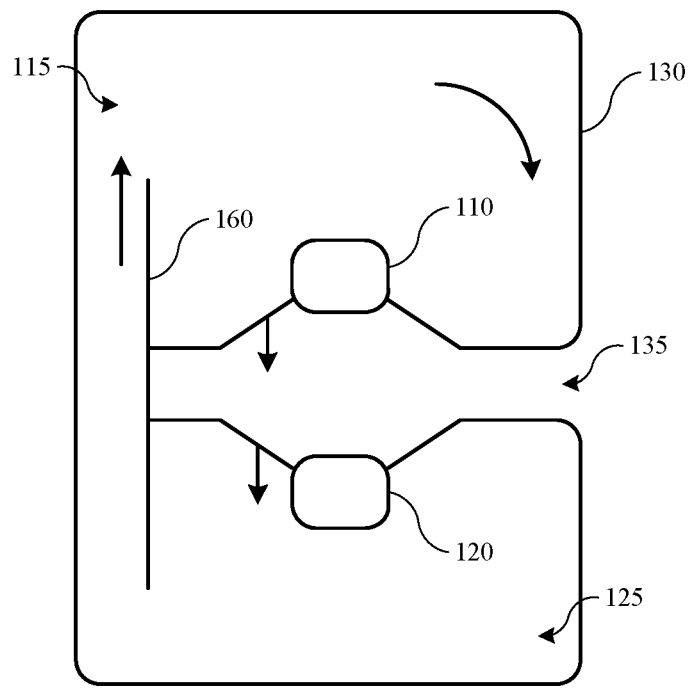
FIG. 3 shows a schematic cross-sectional elevation view of an electronic device according to some embodiments of the present technology.

FIG. 3 shows a schematic cross-sectional elevation view of electronic device 100 in operation according to some embodiments of the present technology. FIG. 3 may include any or all of the components discussed previously, and may include any component identified in FIG. 1. FIG. 3 may illustrate an electronic device according to some embodiments of the present technology when in operation in a second mode, for example, such as a cooling mode. In this mode, signals may be delivered to the loudspeakers from a processor as previously described. Similar to the previous example, one or more processors may deliver a first signal or set of signals to the first loudspeaker 110 and a second signal or set of signals to the second loudspeaker 120. However, in the second mode, the signals may be provided at a frequency configured to limit or prevent noticeable audio output of any of the types previously described. The second signal may be provided to the second loudspeaker to operate the second loudspeaker 120 out of phase with first loudspeaker 110 as illustrated in FIG. 3. By out of phase may be meant that although the speakers may be moving axially in the same direction as illustrated, the loudspeakers may not be producing noticeable audio output, may be effectively canceling some or all audio output from one another, or may be producing limited audio output.

For example, when operating out of phase, the loudspeakers may produce an amount of audio cancellation of output from one another. Additionally, the loudspeakers may be operated as a type of pump to modulate the air volume within the housing 130, while limiting or preventing audio output. The processor and/or circuitry may operate to deliver signals to the loudspeakers at a frequency configured to limit audible output. For example, the human ear typically struggles to recognize audio frequencies below or about 20 Hz. Accordingly, in some embodiments the signals provided in the second mode may be provided at a frequency below or about 20 Hz, below or about 15 Hz, below or about 10 Hz, below or about 5 Hz, or less. The signals may also be delivered at any individual frequency within any of these ranges, or at smaller ranges of frequencies encompassed by any of these noted frequency ranges. By operating the device in such a second mode, system cooling may be afforded during standby, receiving, passive, or other operation that may generate heat within the housing.

Many digital assistants, as one limited example, may have listening and processing functions occurring without specific audio output being produced. In these and other situations, processors and other components may be generating heat within the device, but cooling capabilities such as may be performed in the example discussed with respect to FIG. 2, may not occur. Accordingly, in these situations, among a number of situations, the processors may operate in this second mode to produce airflow currents within the electronic device. Because additional audio output may not be provided, the signals may be provided at frequencies to limit audio production.

By operating the loudspeakers out of phase, the volumetric adjustment of the back volume may occur with lower energy expense, because the back volume may not be specifically compressed, which may otherwise be counter-productive in a cooling system. For example, in a single loudspeaker system, the same low-frequency movement would be required to compress the internal volume within the housing with each back and forth movement, which would increase the work performed, and require increased power. The additional heat generation produced from the increased power—even at low frequency, is likely to overcome the cooling benefit produced through air movement, and the cost may essentially outweigh the benefit of forcing air movement. However, when two speakers are used with an out of phase movement, the overall system volume may be maintained essentially constant, depending on the two loudspeaker sizes relative to one another, while the air mass within the volume is modulated within or between the volumes utilizing the duct. Accordingly, the power required to produce the air circulation may be less than half of the power in a single loudspeaker system, and may be less than or about ¼ of the power, less than or about ⅛ of the power, less than or about 1/10 of the power, or less. This may accordingly reduce the associated heat generation, increasing the efficiency of the cooling. Put another way, in some conventional designs, transducer compliance may be at least three times total system compliance including both the system and the housing. As dissipation in a woofer relates to the square of required force, and required force relates inversely to compliance when operating sufficiently below box resonance, dissipation out of phase may be the square of the inversely noted force. Thus, in one exemplary configuration, when driven out of phase, dissipation may be $⅓^2$ or ⅑ what dissipation may be when driven in phase for the same driver excursion.

Additionally, in systems configured with duct-joined volumes as illustrated, the duct may be employed to create air currents that may circulate air within the individual volumes as illustrated in FIG. 3. For example, where larger open areas between two volumes are used, the excursion of the loudspeakers may not move a sufficient volume of air to cause airflow within or between the two volumes. Accordingly, no circulation of an air mass, either within each volume or between the two volumes may occur. Some embodiments of the present technology may combine two loudspeakers configured as illustrated with a duct between individual volumes to create air currents within each volume due to the outlet velocity that may be produced at the duct outlet to each volume. The amount of volume modulation may be based on the amount of excursion, such as voice coil excursion, of each loudspeaker. Although the actual available excursion may depend on device and loudspeaker size, in some embodiments each loudspeaker may be characterized by a maximum excursion of greater than or about 3 mm, and may be characterized by a maximum excursion of greater than or about 5 mm, greater than or about 7 mm, greater than or about 9 mm, greater than or about 11 mm, greater than or about 13 mm, greater than or about 15 mm, or more.

The signals may be provided to limit an amplitude below a threshold amplitude that may produce chuffing within the specific housing of the electronic device. At low frequencies, and with potential audio cancellation of the loudspeakers operating out of phase, signals of increased amplitude may be used. Increased amplitude will provide increased woofer excursion moving a larger volume of air. The duct cross-sectional area may be sized to produce specific velocities at the outlet during loudspeaker movement, and the combination may produce any of the peak outlet velocities as noted in the ranges listed previously, but with low-frequency signals unlikely to produce audio output. However, velocities may again be maintained below or about 20 m/s in some embodiments to limit chuffing, especially in embodiments in which no audio is being produced to compensate for what may produce audible air movement, and may be maintained below or about 15 m/s, below or about 10 m/s, below or about 5 m/s, or below.

Additionally, in some embodiments the second mode may be employed to produce peak air velocities at either duct outlet greater than or about 1 m/s to ensure air circulation may occur, again depending on actual housing size and configuration. By utilizing loudspeakers in configurations as illustrated with duct-coupled internal volumes, limited power may be consumed to cause airflow within the housing, which may allow cooling that may be greater than heat generated by the power to cause the movement, which may allow convective cooling within the internal air volumes. This may be unlike other configurations where a single speaker may require excessive power to actually compress the air volume, the heat generation of which may be greater than any produced cooling capability.

The present technology may also operate within the first mode and the second mode simultaneously in some embodiments. As explained above with regard to FIG. 2, depending on the amplitude of the signals during audio output in the first mode, the loudspeaker excursion may be limited, which may not produce sufficient airflow velocities at the duct outlets to cause airflow. However, this scenario may also be utilizing limited loudspeaker excursion. Thus, in some embodiments, while a first signal is being provided to the first loudspeaker, and a second signal is being provided to the second loudspeaker to operate the loudspeakers in phase with one another, and at a frequency to produce audio output, the second mode of operation may also be employed. Accordingly, a third signal may be provided to the first loudspeaker at low frequency and a fourth signal may be provided to the second loudspeaker at low frequency and configured to operate the loudspeaker out of phase at low frequency with the first loudspeaker.

Figure 4:
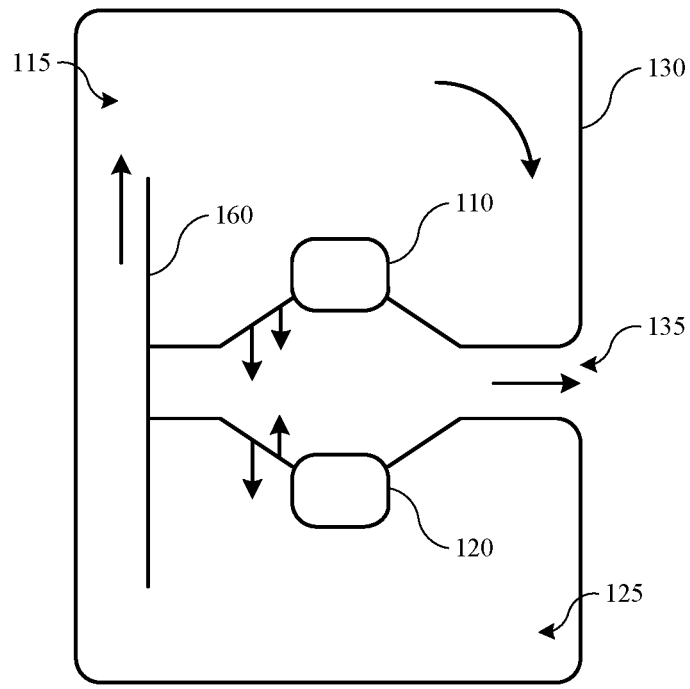
FIG. 4 shows a schematic cross-sectional elevation view of an electronic device according to some embodiments of the present technology.

FIG. 4 shows a schematic cross-sectional elevation view of electronic device 100 in operation according to some embodiments of the present technology, such as when both the first mode of operation and the second mode of operation are being performed simultaneously. FIG. 4 may include any or all of the components discussed previously, and may include any component identified in FIG. 1. As illustrated, first loudspeaker 110 and second loudspeaker 120 may be operating in phase at a first frequency, such as associated with the first mode of operation. Simultaneously, first loudspeaker 110 and second loudspeaker 120 may be operating out of phase at a second frequency, such as at a low frequency associated with the second mode of operation.

The operation in such a simultaneous mode may be determined based on an available max excursion of the loudspeakers. Depending on the configuration of the components or the overall device, there may be a cross-over point or range based on an amplitude in the first mode, which may allow switching from simultaneous mode to first mode only, or initiating operation of the second mode with or without operation of the first mode. This system determination may be affected by environmental considerations as well, which may include ambient temperature, internal volume temperature, and system operation, which may be used to determine potential heat generation. The determination may also be based on other criteria, which may trigger operation of the second mode on or off while operating the loudspeakers in the first mode, or during a period in which the first mode may not be employed. For example, a thermocouple or other temperature measurement device may be coupled at or proximate processors or other heat-sensitive electronic components. When the thermocouple registers a threshold temperature, the second mode of operation of the loudspeakers may be enacted. The determination may further consider whether the first mode is active and any affects being provided by the first mode, and/or the available excursion of the loudspeakers to accommodate the second mode, such as to provide a particular air velocity at the duct inlet/outlet in either internal volume.

Figure 5:
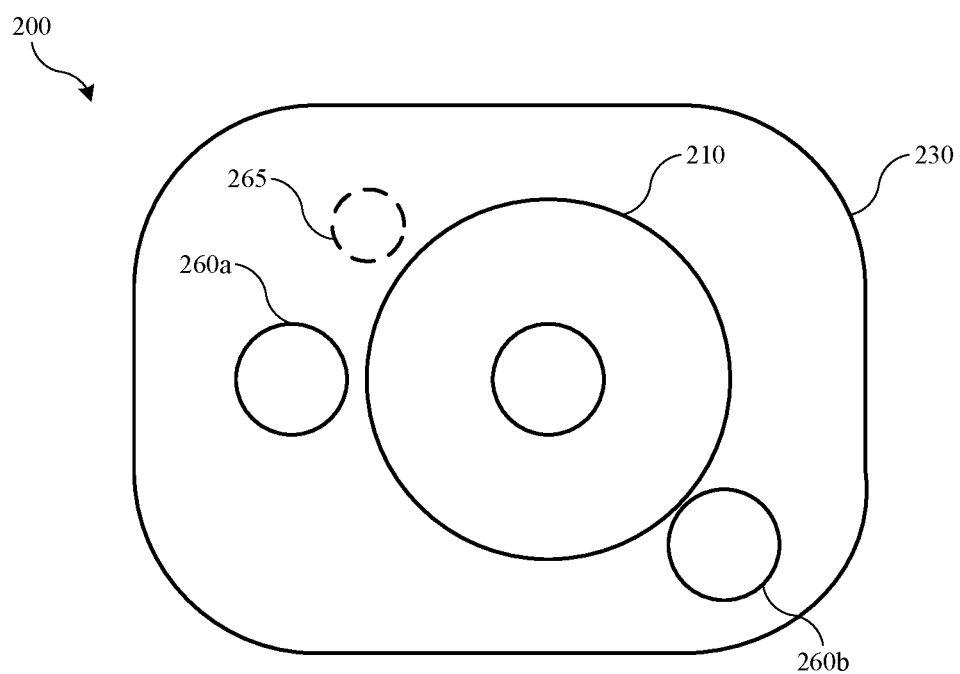
FIG. 5 shows a schematic cross-sectional plan view of an electronic device according to some embodiments of the present technology.

FIG. 5 shows a schematic cross-sectional plan view of an electronic device 200 according to some embodiments of the present technology. FIG. 5 may include any or all of the components discussed previously, and may include any component identified in FIG. 1. FIG. 5 may illustrate a cross section through the housing of an electronic device illustrated elsewhere, such as a cross section along the spacing 135, which may illustrate one loudspeaker as well as a bisected duct and/or housing, for example. The illustrated cross section may be illustrative of either a top or bottom half of a device, which in some embodiments may have similar or identical arrangements. As illustrated, device 200 may include a housing 230. The portion of the housing illustrated may include a loudspeaker 210 seated within the housing 230. As noted previously, loudspeaker 210 may or may not be coaxial with a central longitudinal axis through the device 200. This may be based on location of other components or a general device arrangement, and may not impact operation in a first audio mode or second cooling mode as discussed elsewhere.

The housing may also define one or more apertures in which one or more ducts may be positioned, or the housing may itself define one or more ducts. For example, whether formed or inserted within an aperture housing, a duct 260a may extend between an internal volume behind loudspeaker 210, and an additional internal volume behind a second loudspeaker. In some embodiments, duct 260a may be one of multiple ducts, which may include a second duct 260b elsewhere about the device, and also extending between a first internal volume and a second internal volume. Ducts 260 may be positioned anywhere about the device, and may be positioned for aesthetic effect, as well as for acoustic effect, such as positioned to limit interference with audio delivery from device 200. Additionally, one or more ducts may be positioned to access air known to be of a lower temperature. For example, based on an electronic distribution within the device, certain regions or zones within the enclosure may be characterized by lower internal air temperatures. One or more ducts may be positioned proximate such a zone to access and utilize this cooler air during operations. In some embodiments one or more additional and optional ducts 265 may provide access through the device for wiring or other components. In other embodiments, ducts 265 may be combined with ducts 260 to provide access through the device for wiring or other components as well as for airflow between the two ducts.

The duct sizing illustrated may not be to any particular scale, and ducts may be included of virtually any size or dimension. Additionally, ducts may be included having different sizes, or included asymmetrically. Asymmetry of the incorporation may provide access to drive flow in through one particular duct and out through another. This may further afford an ability to circulate air through a larger section of the device in some embodiments. The duct may be sized to produce particular peak air velocities as discussed above, and may also be sized to afford particular air circulation. For example, the loudspeaker cone surface area may determine the volumetric amount of air movement during excursion during operation in the second mode. The duct may also be characterized by a volume based on the duct length and cross-sectional area. Depending on the relationship between these components, operation of the loudspeakers in a second cooling mode may or may not move a volume of air greater than a duct volume.

When the volume distributed by the loudspeaker is less than the duct volume, the device may still create currents within each internal volume. These currents may afford partial or complete circulation within each internal volume, which may increase the heat transfer availability from a relatively thin stratified layer of air proximate components to the entire air volume within the internal volume. Additionally, in embodiments when the volume distributed by the loudspeakers is greater than the duct volume, air may also be distributed between the two internal volumes, further expanding the heat transfer capabilities of the device. By utilizing multiple loudspeakers having volumes joined by a duct according to aspects of the present technology, internal circulation and cooling may be provided in a number of modes that may obviate the need for an internal fan, or may augment the heat transfer capabilities of a fan system. The cooling provided may be characterized by reduced noise generation relative to other moving components, and may enhance device efficiency and allow for more compact device designs than conventional technology.

One or more computing devices or components may be adapted to provide some of the desired functionality described herein by accessing software instructions rendered in a computer-readable form. The computing devices may process or access signals for operation of one or more of the components of the present technology, such as the loudspeakers, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the duct" includes reference to one or more ducts and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electronic device comprising:
   a first loudspeaker;
   a second loudspeaker;
   a housing in which the first loudspeaker and the second loudspeaker are disposed, wherein:
      the housing defines a first internal volume between a first end of the housing and a backside of the first loudspeaker;
      the housing defines a second internal volume between a second end of the housing and a backside of the second loudspeaker; and
      the first loudspeaker and the second loudspeaker are positioned within the housing so a front side of the first loudspeaker faces a front side of the second loudspeaker;
   a duct defined by the housing, the duct accessing the first internal volume at a first end of the duct and accessing the second internal volume at a second end of the duct; and
   a processor configured to deliver signals to the first loudspeaker and the second loudspeaker.

2. The electronic device of claim 1, wherein the first loudspeaker and the second loudspeaker are axially aligned.

3. The electronic device of claim 1, wherein the first internal volume and the second internal volume are of dissimilar size.

4. The electronic device of claim 1, further comprising a plurality of ducts extending between the first internal volume and the second internal volume.

5. The electronic device of claim 1, wherein the processor is configured to deliver signals in a first mode that operates the first loudspeaker in phase with the second loudspeaker to produce an audio output from the electronic device.

6. The electronic device of claim 5, wherein the processor is configured to deliver signals in a second mode that operates the first loudspeaker out of phase with the second loudspeaker.

7. The electronic device of claim 6, wherein the signals delivered in the second mode are at frequencies below about 20 Hz.

8. The electronic device of claim 6, wherein signals delivered in the second mode are configured to produce airflow from the duct within the first internal volume or the second internal volume.

9. The electronic device of claim 8, wherein the airflow is characterized by a velocity at the first end of the duct of greater than or about 1 m/s.

10. The electronic device of claim 6, wherein the processor is further configured to operate in the first mode and the second mode simultaneously.

11. An audio system comprising:
    a sealed enclosure;
    a first loudspeaker disposed in the sealed enclosure and at least partially defining a first internal volume of the sealed enclosure;

a second loudspeaker disposed in the sealed enclosure and at least partially defining a second internal volume of the sealed enclosure;

a duct extending between the first internal volume of the sealed enclosure and the second internal volume of the sealed enclosure;

a processor; and memory having stored therein instructions which when executed by the processor:

deliver a first signal to the first loudspeaker; and deliver a second signal to the second loudspeaker causing the second loudspeaker to operate out of phase with the first loudspeaker causing airflow within the sealed enclosure.

12. The audio system of claim 11, wherein the first loudspeaker and the second loudspeaker are disposed within the sealed enclosure facing one another, and wherein the first loudspeaker and the second loudspeaker are axially aligned.

13. The audio system of claim 11, wherein the first loudspeaker and the second loudspeaker are similarly sized woofers.

14. The audio system of claim 13, wherein the first loudspeaker and the second loudspeaker are each characterized by a maximum excursion of at least about 5 mm.

15. The audio system of claim 11, wherein the first signal and the second signal are each at a frequency below or about 20 Hz.

16. The audio system of claim 11, wherein the instructions, when executed by the processor, further:

deliver a third signal to the first loudspeaker; and deliver a fourth signal to the second loudspeaker causing the second loudspeaker to operate in phase with the first loudspeaker causing audio output from the audio system.

17. The audio system of claim 16, wherein delivery of the second signal to the second loudspeaker and delivery of the fourth signal to the second loudspeaker overlap in time.

18. An electronic device comprising:

a first loudspeaker;

a second loudspeaker;

a housing in which the first loudspeaker and the second loudspeaker are disposed, wherein:

the housing defines a first internal volume between a first end of the housing and a backside of the first loudspeaker;

the housing defines a second internal volume between a second end of the housing and a backside of the second loudspeaker; and the first loudspeaker and the second loudspeaker are positioned within the housing so a front side of the first loudspeaker faces a front side of the second loudspeaker;

a duct defined by the housing, the duct accessing the first internal volume at a first end of the duct and accessing the second internal volume at a second end of the duct; and a processor configured to deliver signals in a cooling mode that operates the first loudspeaker out of phase with the second loudspeaker.

19. The electronic device of claim 18, wherein the processor is further configured to deliver signals in an audio mode that operates the first loudspeaker in phase with the second loudspeaker to produce an audio output from the electronic device.

20. The electronic device of claim 19, wherein the processor is configured to deliver signals in the cooling mode and signals in the audio mode simultaneously.

* * * * *